US011069719B2

(12) United States Patent
Xu et al.

(10) Patent No.: US 11,069,719 B2
(45) Date of Patent: Jul. 20, 2021

(54) ARRAY SUBSTRATE AND METHOD OF MANUFACTURING THE SAME, DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Wenqing Xu, Beijing (CN); Xiaolong Li, Beijing (CN); Xiaoxiang Zhang, Beijing (CN); Mingxuan Liu, Beijing (CN); Zumou Wu, Beijing (CN); Huibin Guo, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 13 days.

(21) Appl. No.: 16/503,053

(22) Filed: Jul. 3, 2019

(65) Prior Publication Data

US 2020/0013804 A1 Jan. 9, 2020

(30) Foreign Application Priority Data

Jul. 6, 2018 (CN) ........................ 201810737984.X

(51) Int. Cl.
*H01L 27/12* (2006.01)
*H01L 27/32* (2006.01)
*G02F 1/1362* (2006.01)

(52) U.S. Cl.
CPC ...... *H01L 27/124* (2013.01); *G02F 1/136277* (2013.01); *H01L 27/127* (2013.01);
(Continued)

(58) Field of Classification Search
CPC ............... H01L 27/124; H01L 27/1218; H01L 27/1262; H01L 27/127; H01L 27/3276;
(Continued)

(56) References Cited

U.S. PATENT DOCUMENTS

2004/0257510 A1 12/2004 Chae
2007/0171342 A1 7/2007 Yang et al.
(Continued)

FOREIGN PATENT DOCUMENTS

CN 1573485 A 2/2005
CN 103176322 A 6/2013
(Continued)

OTHER PUBLICATIONS

First Office Action issued in corresponding Chinese Application No. 201810737984.X, dated Sep. 27, 2020, with English language translation.

*Primary Examiner* — Cuong B Nguyen
(74) *Attorney, Agent, or Firm* — McDermott Will and Emery LLP

(57) ABSTRACT

An array substrate includes a base substrate, a plurality of signal lines disposed at a side of the base substrate, and an organic layer disposed at a side of the plurality of signal lines facing away from the base substrate. The organic layer includes at least one auxiliary portion and a reference portion surrounding the at least one auxiliary portion, and a thickness of each auxiliary portion is less than a thickness of the reference portion.

16 Claims, 7 Drawing Sheets

(52) U.S. Cl.
CPC ...... *H01L 27/1218* (2013.01); *H01L 27/1262* (2013.01); *H01L 27/3276* (2013.01)

(58) Field of Classification Search
CPC ... H01L 27/3248; H01L 27/3241–3297; H01L 51/50–56; H01L 51/0032–0095; H01L 27/3202–3204; H01L 27/3209; H01L 27/3225–3234; H01L 27/1248; H01L 27/3258; H01L 27/3246; G02F 2001/13606; G02F 1/136227; G02F 1/1333; G02F 2201/123; G09F 9/00; G01F 1/136213
See application file for complete search history.

(56) References Cited

U.S. PATENT DOCUMENTS

2013/0162926 A1 6/2013 Kwack et al.
2016/0291750 A1 10/2016 Chai et al.

FOREIGN PATENT DOCUMENTS

CN 103295959 A 9/2013
CN 104698709 A 6/2015

ARRAY SUBSTRATE AND METHOD OF MANUFACTURING THE SAME, DISPLAY DEVICE

CROSS-REFERENCE TO RELATED APPLICATION

This application claims priority to Chinese Patent Application No. 201810737984.X, filed with the Chinese Patent Office on Jul. 6, 2018, titled "ARRAY SUBSTRATE AND METHOD OF MANUFACTURING THE SAME, DISPLAY DEVICE", which is incorporated herein by reference in its entirety.

TECHNICAL FIELD

The present disclosure relates to the field of display technologies, and in particular, to an array substrate and a method of manufacturing the same, and a display device.

BACKGROUND

In recent years, thin film transistors (abbreviated as TFTs) are used as driving switches for pixel units in a TFT array substrate, which is widely used in display devices such as mobile phones and computers.

SUMMARY

In an aspect, an array substrate is provided, and the array substrate includes a base substrate, a plurality of signal lines disposed at the base substrate, and an organic layer disposed at a side of the plurality of signal lines facing away from the base substrate.

The organic layer includes at least one auxiliary portion and a reference portion surrounding the at least one auxiliary portion. A thickness of each auxiliary portion is less than a thickness of the reference portion.

In some embodiments, an orthographic projection of each auxiliary portion on the base substrate is located outside a range of an orthographic projection of the plurality of signal lines on the base substrate.

In some embodiments, the array substrate further includes at least one electrode disposed at a side of the organic layer facing away from the base substrate.

In some embodiments, the thickness of each auxiliary portion is less than or equal to one third of the thickness of the reference portion.

In some embodiments, the thickness of each auxiliary portion is less than or equal to a value in a range of 0.8 μm to 1.2 μm.

In some embodiments, the reference portion is connected to the at least one auxiliary portion.

In some embodiments, the at least one auxiliary portion includes a plurality of auxiliary portion, and thicknesses of the auxiliary portions are the same.

In some embodiments, the plurality of signal lines are selected from a group consisting of: a plurality of gate lines, a plurality of data lines, a plurality of common electrode lines, and a combination thereof.

In some embodiments, the at least one electrode includes at least one pixel electrode; or the at least one electrode includes at least one common electrode; or the at least one electrode includes at least one pixel electrode and at least one common electrode.

In some embodiments, the array substrate further includes a plurality of thin film transistors disposed between the base substrate and the reference portion of the organic layer.

In some embodiments, an orthographic projection of each auxiliary portion on the base substrate is further located outside a range of an orthographic projection of the plurality of thin film transistors on the base substrate.

In another aspect, a method of manufacturing an array substrate is provided, and the method of manufacturing an array substrate includes providing a base substrate; forming a plurality of signal lines at a side of the base substrate; and forming an organic layer at a side of the plurality of signal lines facing away from the base substrate.

The organic layer includes at least one auxiliary portion and a reference portion surrounding the at least one auxiliary portion. A thickness of each auxiliary portion is less than a thickness of the reference portion.

In some embodiments, an orthographic projection of each auxiliary portion on the base substrate is located outside a range of an orthographic projection of the plurality of signal lines on the base substrate.

In some embodiments, the method of manufacturing the array substrate further includes forming at least one electrode at a side of the organic layer facing away from the base substrate.

In some embodiments, the step of forming an organic layer at a side of the plurality of signal lines facing away from the base substrate, includes forming an organic material film at a side of the plurality of signal lines facing away from the base substrate; forming a photoresist layer on the surface of the organic material film facing away from the base substrate; exposing the photoresist layer through a half-tone mask and developing the exposed photoresist layer, so as to form a patterned photoresist layer; and etching the organic material film by using the patterned photoresist layer as a mask, so that the etched organic material film is the organic layer including the reference portion and the at least one auxiliary portion.

In some embodiments, after the step of forming an organic layer at a side of the plurality of signal lines facing away from the base substrate, the manufacturing method further includes drying the organic layer.

In some embodiments, the step of forming the plurality of signal lines at a side of the base substrate, includes forming a plurality lines selected from a group consisting of a plurality of gate lines, a plurality of data lines, a plurality of common electrode lines, and a combination thereof.

In some embodiments, the step of forming the at least one electrode at a side of the organic layer facing away from the base substrate, includes forming at least one pixel electrode at a side of the organic layer facing away from the base substrate; or forming at least one common electrode at a side of the organic layer facing away from the base substrate; or forming at least one pixel electrode and at least one common electrode at a side of the organic layer facing away from the base substrate.

In yet another aspect, a display device is provided, which includes the above array substrate.

BRIEF DESCRIPTION OF THE DRAWINGS

The accompanying drawings described herein are intended to provide a further understanding of the present disclosure and constitute a part of the present disclosure. The illustrative embodiments of the present disclosure and the description thereof serve to explain the present disclosure, but do not constitute an undue limitation of the present disclosure.

DETAILED DESCRIPTION

Figure 1:
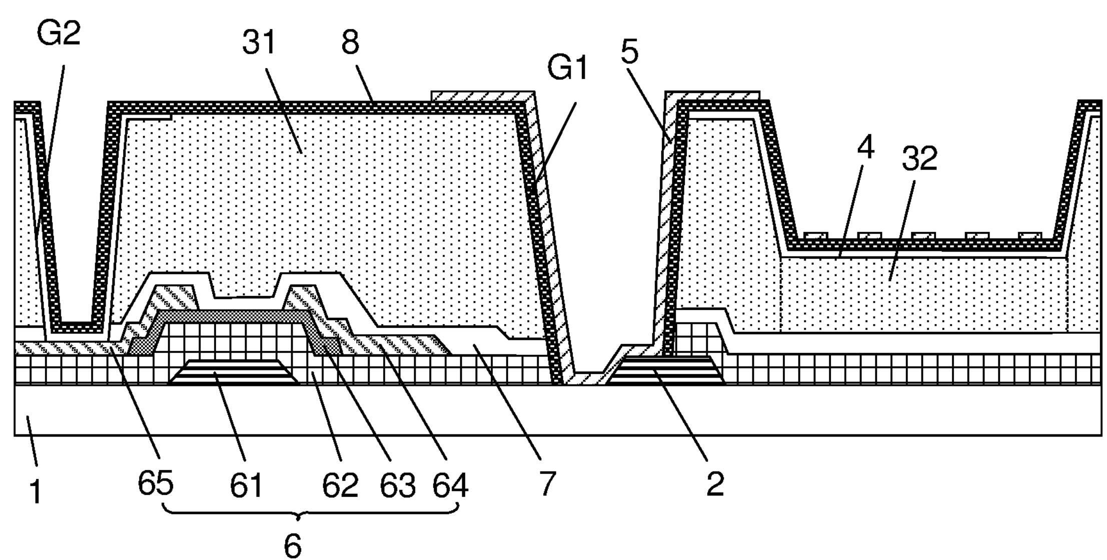
FIG. 1 is a schematic diagram of an array substrate, according to some embodiments of the present disclosure.

In order to further describe an array substrate and a method of manufacturing the same, and a display device provided by some embodiments of the present disclosure, a detailed description is given below with reference to the accompanying drawings.

Terms "first" and "second" are used for descriptive purposes only and are not to be construed as indicating or implying the relative importance or implicitly indicating the number of indicated technical features. Thus, features defined as "first", "second" may explicitly or implicitly include one or more of the features. In the description of the present disclosure, "plurality" means two or more unless otherwise specified.

Referring to FIGS. 1-7, some embodiments of the present disclosure provide an array substrate 100. The array substrate 100 includes a base substrate 1, a plurality of signal lines 2 disposed at a side of the base substrate 1, and an organic layer 3 disposed at a side of the plurality of signal lines 2 facing away from the base substrate 1.

In some examples, the array substrate 100 is an array substrate of a liquid crystal display (LCD), which is also referred to as an LCD substrate. In this case, the base substrate 1 in the LCD substrate is, for example, a rigid base substrate, such as a glass base substrate.

In some other examples, the array substrate 100 is an array substrate of an organic light-emitting diode (OLED), which is also referred to as an OLED substrate. In this case, the base substrate 1 in the OLED substrate is, for example, a rigid base substrate, such as a glass base substrate. For another example, the base substrate 1 in the OLED substrate is a flexible base substrate, such as a polyethylene terephthalate (PET) base substrate, a polyethylene naphthalate (PEN) base substrate or a polyimide (PI) base substrate.

The description that the plurality of signal lines 2 are disposed at a side of the base substrate 1, at least includes the following two situations. For example, the plurality of signal lines 2 are directly disposed on a surface of the base substrate 1. That is, there are no layers disposed between the plurality of signal lines 2 and the base substrate 1. For another example, the array substrate further includes at least one layer disposed between the plurality of signal lines 2 and the base substrate 1.

The description that the organic layer 3 is disposed at a side of the plurality of signal lines 2 facing away from the base substrate 1, at least includes the following two situations. For example, the organic layer 3 is directly disposed on a surface of the plurality of signal lines 2 facing away from the base substrate 1. For another example, the array substrate further includes at least one layer disposed between the organic layer 3 and the plurality of signal lines 2.

In some examples, the at least one layer includes a plurality of layers, and the organic layer 3 is disposed on a surface of a layer of the plurality of layers facing away from the base substrate 1, and this layer is farthest from the base substrate 1.

In some embodiments, as shown in FIGS. 1-5, the organic layer 3 includes at least one auxiliary portion 32 and a reference portion 31 surrounding the at least one auxiliary portion 32, and a thickness of each auxiliary portion 32 is less than a thickness of the reference portion 31.

It will be noted that, dotted lines in FIG. 1 indicates a boundary line between the reference portion 31 and the auxiliary portion 32, and the dotted lines are mere used to illustrate the structure of the organic layer 3 and do not actually exist.

In some examples, the at least one auxiliary portion 32 is formed by a thinning process. That is, in a case where at least one portion of an organic film having a uniform thickness is thinned, each thinned portion constitutes an auxiliary portion 32 described above, and the remaining portion constitutes the above reference portion 31. In this way, the thickness of each auxiliary portion 32 is less than the thickness of the reference portion 31.

Figure 5:
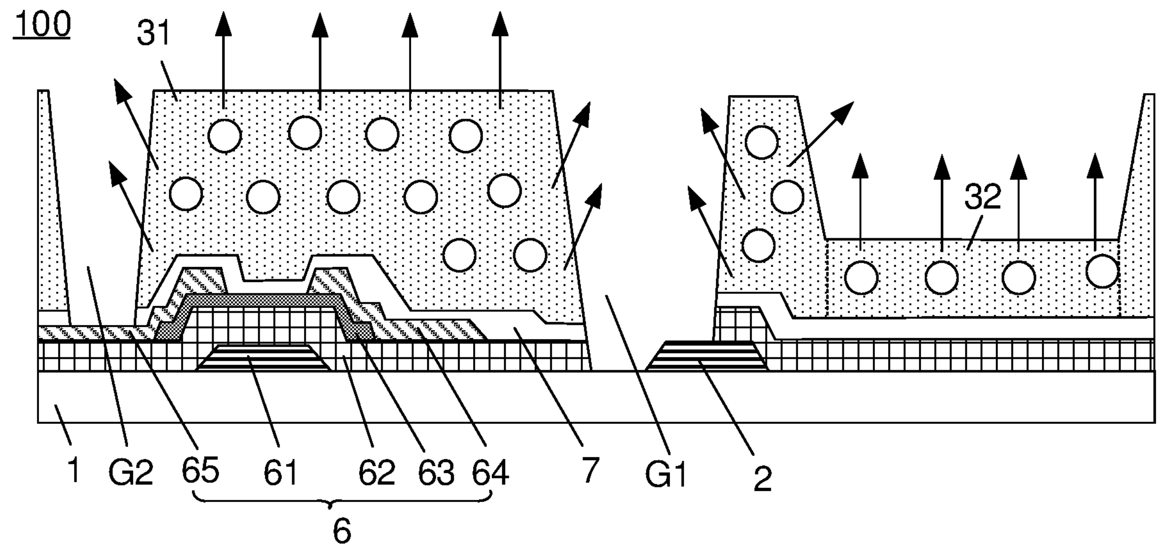
FIG. 5 is an effect diagram of degassing an organic layer during drying, according to some embodiments of the present disclosure.

Since the at least one auxiliary portion 32 has a smaller thickness, the content of an organic substance in the auxiliary portion 32 that is easily volatilized by heating is small, and thus the total content of the organic substance in the organic layer 3 that is easily volatilized by heating may be effectively reduced. Moreover, the organic substance in the organic layer 3 that is easily volatilized by heating may be easily volatilized in a drying process for the organic layer 3 as much as possible, so as to increase a degassing efficiency of the organic layer 3 (a degassing effect of the organic layer 3 during the drying process is shown in FIG. 5). In this way, in the process of forming other layer(s) on the organic layer 3, a phenomenon of bubble retention due to the influence of the manufacturing process can be avoided or reduced, thereby improving the quality of the array substrate.

In some embodiments, the reference portion 31 and the at least one auxiliary portion 32 are coupled to each other. That is, the reference portion 31 and the at least one auxiliary portion 32 are an integrated structure. In this way, the reference portion 31 and the at least one auxiliary portion 32 may be formed by processing (e.g., etching) the same organic material film, thereby simplifying the manufacturing process of the array substrate.

In some embodiments, the at least one auxiliary portion includes a plurality of auxiliary portions, and thicknesses of the auxiliary portions are the same.

In some embodiments, as shown in FIG. 1, an orthographic projection of each auxiliary portion 32 on the base substrate 1 is located outside a range of an orthographic projection of the plurality of signal lines 2 on the base substrate 1.

In this way, in a case where the array substrate 100 further includes other conductive components (e.g., the electrodes) disposed above the signal lines 2, the thickness of each auxiliary portion 32 does not have an adverse influence on the effect of reducing parasitic capacitances between the signal lines 2 and the other conductive components (e.g., the electrodes), that is, the thickness of each auxiliary portion 32 does not have an adverse influence on the effect of reducing loads of the signal lines 2.

In some embodiments, the array substrate has a plurality of sub-pixel regions arranged in an array, and each sub-pixel region corresponds to a sub-pixel. The array substrate further includes pixel driving circuits disposed between the reference portion 31 and the base substrate 1, and each pixel driving circuit is located in a corresponding sub-pixel region. Each pixel driving circuit includes a storage capacitor and at least one switching unit (e.g., at least one thin film transistor (TFT) 6).

In some embodiments, an orthographic projection of each auxiliary portion 32 on the base substrate 1 is further located outside orthographic projections of the pixel driving circuits on the base substrate 1. That is, an orthographic projection of each auxiliary portion 32 on the base substrate 1 is located outside orthographic projections of the at least one TFT 6 on the base substrate 1. In this way, in a case where the array substrate 100 further includes other conductive components (e.g., the electrodes) disposed above the pixel driving circuits, the thickness of the auxiliary portion 32 will not have an adverse influence on the effect of reducing parasitic capacitances between the pixel driving circuits and the other conductive components (e.g., the electrodes), that is, the thickness of the auxiliary portion 32 will not have an adverse influence on the effect of reducing loads and power consumption of the array substrate.

In some embodiments, the plurality of signal lines 2 include a plurality of gate lines, a plurality of data lines and a plurality of common electrode lines. It will be noted that, the signal line 2 in FIGS. 1-5 is only illustrated by taking the common electrode line as an example.

Figure 2:
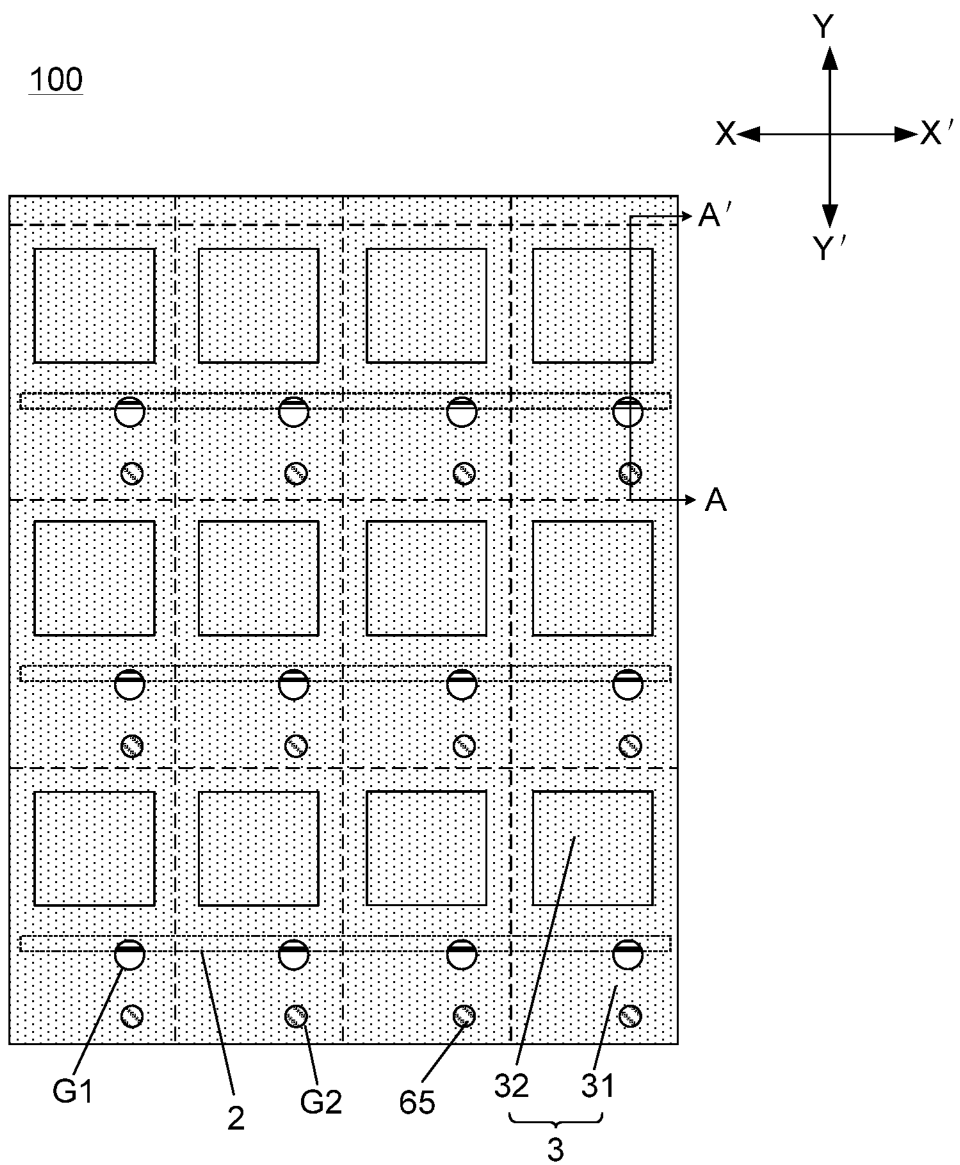
FIG. 2 is a schematic diagram of another array substrate, according to some embodiments of the present disclosure.

An extending direction of each gate line is generally parallel (or approximately parallel) to a row direction X-X' as shown in FIG. 2, and each gate line is coupled to pixel driving circuits located in at least one row of sub-pixel regions, so as to provide driving signals to the pixel driving circuits located in the at least one row of sub-pixel regions. For example, each gate line is coupled to pixel driving circuits located in a corresponding row of sub-pixel regions, or each gate line is coupled to pixel driving circuits located in corresponding adjacent two rows of sub-pixel regions.

In some embodiments, the plurality of gate lines are disposed in a same layer. In this way, the plurality of gate lines may be formed by using a same material in a single patterning process. For example, the plurality of gate lines are formed by etching a same first metal film, and the first metal film is made of a metal material, such as aluminum (Al), copper (Cu), molybdenum (Mo), or titanium (Ti).

In some embodiments, the plurality of common electrode lines and the plurality of gate lines are disposed in a same layer, and the extending direction of the common electrode lines are parallel (or approximately parallel) to the extending direction of the gate lines. In this way, the plurality of common electrode lines and the plurality of gate lines may be formed by using a same material in a single patterning process.

The extending direction of each data line is generally parallel (or approximately parallel) to a column direction Y-Y' as shown in FIG. 2, and each data line is coupled to pixel driving circuits located in at least one column of sub-pixel regions, so as to provide data signals to the pixel driving circuits located in the at least one column of sub-pixel regions. For example, each data line is coupled to pixel driving circuits located in a corresponding column of sub-pixel regions, or each data line is coupled to pixel driving circuits located in corresponding adjacent two columns of sub-pixel regions.

In some embodiments, the plurality of data lines are disposed in a same layer. In this way, the plurality of data lines may be formed by using a same material in a single patterning process. For example, the plurality of data lines are formed by etching a same second metal film, and the second metal film is made of a metal material, such as Mo, Al, Cu, or chromium (Cr).

It will be noted that, the plurality of gate lines and the plurality of data lines are disposed in different layers, and the gate lines and the data lines are generally crossed. The array substrate 100 further includes at least one insulating layer disposed between the plurality of gate lines and the plurality of data lines, so as to electrically insulate the plurality of gate lines from the plurality of data lines.

The above patterning process includes a photolithography process, or a process including a photolithography process and an etching process. The photolithography process refers to a process including a film formation (for example, a film formation by chemical vapor deposition (CVD)), an exposure, a development, and the like, and forming a pattern by using a photoresist, a mask, an exposure machine, or the like.

In some other embodiments, the plurality of signal lines 2 only includes one kind of signal lines. For example, the plurality of signal lines 2 only includes gate lines, or data lines, or common electrode lines. In some other embodiments, the plurality of signal lines only includes two kinds of signal lines. For example, the plurality of signal lines only includes gate lines and data lines, or includes data lines and common electrode lines, or includes gate lines and common electrode lines.

In some examples, each pixel driving circuit includes at least one thin film transistor (TFT) 6 disposed between the base substrate 1 and the reference portion 31. An orthographic projection of each TFT 6 on the base substrate 1 is within the range of the orthographic projection of the reference portion 31 on the base substrate 1, and the orthographic projection of each TFT 6 on the base substrate 1 does not overlap with the orthographic projection of each auxiliary portion 32 on the base substrate 1.

The structure of each TFT 6 may be determined according to actual needs. In some embodiments, each TFT 6 has a top gate structure. In some other embodiments, each TFT 6 has a bottom gate structure. For example, as shown in FIGS. 1-5, the TFT 6 includes a gate 61 and an active layer 63 sequentially disposed on the base substrate 1, and a source 64 and a drain 65 disposed on a surface of the active layer 63 facing away from the base substrate 1. The source 64 and the drain 65 are disposed in a same layer.

In some embodiments, gates 61 of the TFTs 6 are disposed in the same layer as the gate lines and the common electrode lines. In this case, a gate 61 is coupled to a corresponding gate line, and the gate 61 and the gate line are an integrated structure.

In some embodiments, the sources 64 and the drains 65 in the TFTs 6 are disposed in the same layer as the data lines. In this case, a source 64 is coupled to a corresponding data line, and the source 64 and the data line are an integrated structure.

In some embodiments, the array substrate 100 further includes a gate insulating layer 62 disposed between the gate 61 and the active layer 63, so as to electrically insulate the gate 61 from the active layer 63.

In some embodiments, as shown in FIGS. 1 and 3-5, the array substrate 100 further includes a first passivation layer 7 disposed between the organic layer 3 and the TFTs 6.

Figure 3:
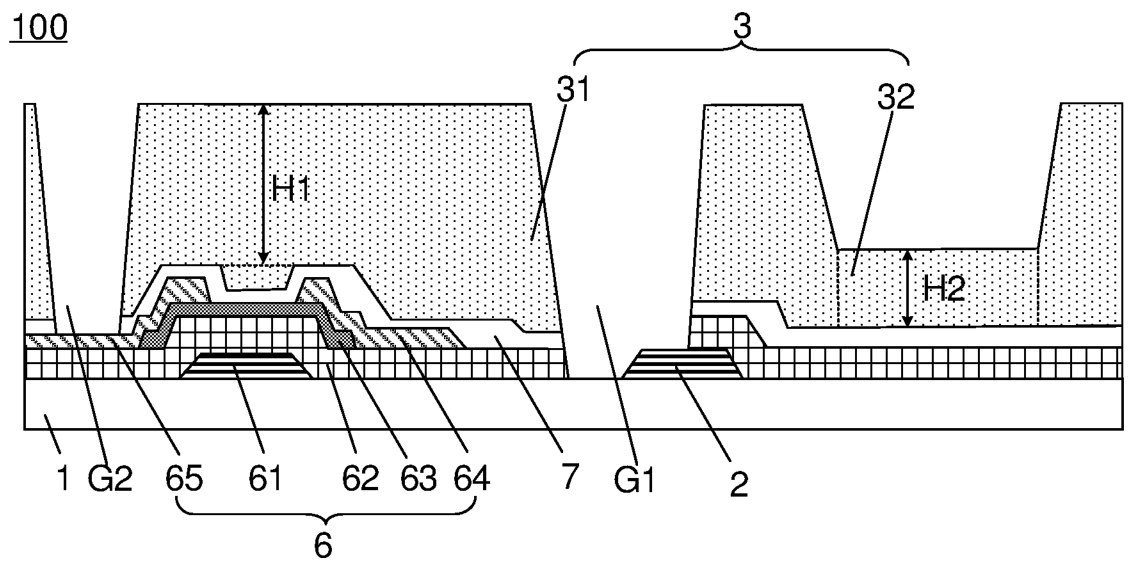
FIG. 3 is a cross-section diagram of the array substrate shown in FIG. 2 taken along line A-A'.

In some examples, referring to FIGS. 1, 3 and 5, a surface of the first passivation layer 7 facing away from the base substrate 1 is uneven due to the TFTs 6. As a result, a surface of the organic layer 3 proximate to the base substrate 1 is also uneven.

In this case, the thickness H1 of the reference portion 31 is set to be the minimum distance between the surface of the reference portion 31 proximate to the base substrate 1 and the surface of the organic layer 3 facing away from the base substrate 1. The thickness H2 of each auxiliary portion 32 is set to be the minimum distance between the surface of the auxiliary portion 32 proximate to the base substrate 1 and the surface of the auxiliary portion 32 facing away from the base substrate 1.

Figure 4:
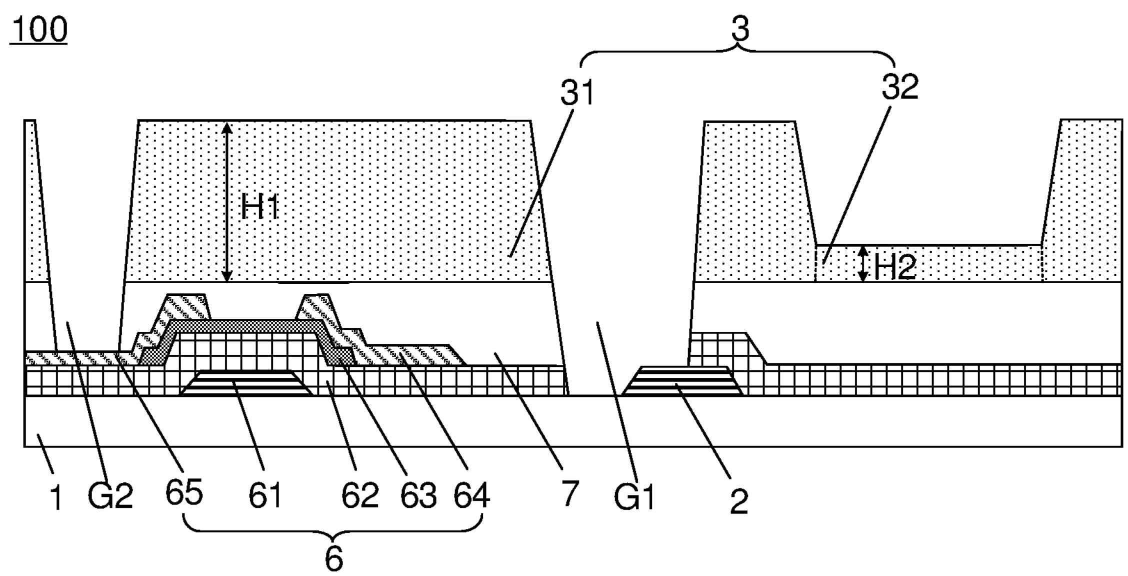
FIG. 4 is a cross-section diagram of the array substrate shown in FIG. 2 taken along line A-A'.

In some other embodiments, referring to FIG. 4, the surface of the first passivation layer 7 facing away from the base substrate 1 is flat. As a result, the surface of the organic layer 3 proximate to the base substrate 1 is also flat.

In this case, the reference portion 31 has the same thickness H1 in different cross sections, and each auxiliary portion 32 has the same thickness H2 in different cross sections.

The thickness H2 of each auxiliary portion 32 in the organic layer 3 can be set according to actual needs.

In some embodiments, the thickness H2 of each auxiliary portion 32 is less than or equal to one third (⅓) of the thickness H1 of the reference portion 31, $H2 \leq \frac{1}{3}$ of $H1$. That is, when a region of the above organic material film is thinned to form the auxiliary portion 32, a thickness of a portion of the above region removed in the organic material film is at least ⅔ of an original thickness of the organic material film.

In some embodiments, the thickness H2 of each auxiliary portion 32 is set to be less than or equal to a value in a range of 0.8 μm to 1.2 μm ($H2 \leq 0.8\ \mu m \sim 1.2\ \mu m$). In this way, the total volume of the organic layer 3 may be effectively reduced, thereby effectively reducing the total content of the organic substance that is easily volatilized by heating in the organic layer 3. Moreover, it is also convenient to make the organic substance that is easily volatilized by heating in the organic layer 3 relatively completely volatilized during the drying process, thereby achieving a good degassing effect.

In some embodiments, the array substrate 100 further includes at least one electrode disposed at a side of the organic layer 3 facing away from the base substrate 1.

The description that the at least one electrode is disposed at a side of the organic layer 3 facing away from the base substrate 1, at least includes the following two situations. For example, the at least one electrode is disposed on a surface of the organic layer 3 facing away from the base substrate 1. For another example, the array substrate further includes at least one layer disposed between at least one electrode and the organic layer 3.

In some examples, the at least one layer includes a plurality of layers, and the at least one electrode is disposed on a surface of a layer of the plurality of layers facing away from the base substrate 1, and this layer is farthest from the base substrate 1.

In this case, in some embodiments, as shown in FIGS. 1 and 2, the reference portion 31 includes portions of the organic layer 3 each of which is located in a first region that is located between a corresponding signal line 2 and a corresponding electrode directly opposite the signal line 2. The reference portion 31 further includes other portions of the organic layer 3 each of which is located in a second region that is located between a corresponding pixel driving circuit and a corresponding electrode directly opposite the pixel driving circuit. Since the array substrate 100 includes the signal lines 2 and the pixel driving circuits, a region where the reference portion 31 is located includes a plurality of first regions and a plurality of second regions described above.

The reference portion 31 included in the organic layer 3 serves as a main part of the organic layer 3, and its thickness (that is, the distance between a surface of the reference portion 31 proximate to the base substrate 1 and a surface of the reference portion 31 facing away from the base substrate 1) is obtained according to actual needs, so as to avoid a parasitic capacitance from existing between a signal line 2 and a corresponding electrode, or to effectively reduce a parasitic capacitance that occurs between the signal line 2 and the electrode.

In this case, the reference portion 31 is disposed between the TFTs 6 and the at least one electrode, and thus the reference portion 31 may be utilized to avoid the parasitic capacitance from existing between each TFT 6 and a corresponding electrode, or to effectively reduce the parasitic capacitance that exists between the TFT 6 and the electrode, so that each TFT 6 has a good stability, thereby ensuring a good stability of the array substrate 100.

The at least one electrode includes one electrode or a plurality of electrodes. In a case where the at least one electrode includes one electrode, the electrode is a whole layer of electrode corresponding to the plurality of sub-pixel regions. The at least one electrode will be described below by taking the at least one electrode includes a plurality of electrodes as an example.

In some embodiments, as shown in FIG. 1, the plurality of electrodes includes pixel electrodes 4, and each pixel electrode 4 is located in a corresponding sub-pixel region of the array substrate 100.

In some other embodiments, the plurality of electrodes includes common electrodes 5, and each common electrode 5 is located in a corresponding sub-pixel region of the array substrate 100. Here, for example, common electrodes 5 in the sub-pixel regions are an integrated structure, that is, the common electrodes 5 are coupled to each other.

It will be understood that, in a case where the extending direction of each common electrode line and the extending direction of each gate line are parallel (or approximately parallel) to each other, each common electrode line is coupled to common electrodes 5 located in at least one row of sub-pixel regions, so as to provide a same common voltage signal to the common electrodes 5 located in the at least one row of sub-pixel regions. For example, each common electrode line is coupled to common electrodes 5 located in a corresponding row of sub-pixel regions, or each common electrode line is coupled to common electrodes 5 located in corresponding adjacent two rows of sub-pixel regions.

In some other embodiments, the at least one electrode includes pixel electrodes 4 and common electrodes 5, and each sub-pixel region is provided with a pixel electrode 4 and a common electrode 5.

Hereinafter, the array substrate is illustrated by taking the at least one electrode including pixel electrodes 4 and common electrodes 5 as an example.

In some embodiments, the pixel electrodes 4 and the common electrodes 5 are disposed in the same layer. In this case, the array substrate 100 is, for example, an in-plane switching (IPS) array substrate or an advanced super dimension switch (ADS) array substrate.

In addition, the pixel electrodes 4 and the common electrodes 5 may be formed by etching a same third metal film. The third metal film is made of an indium tin oxide (ITO) material or an indium zinc oxide (IZO) material.

On this basis, in some embodiments, a plurality of first via holes are formed in the reference portion 31 and the first passivation layer 7, and each of the pixel electrodes 4 is coupled to the drain 65 of a corresponding TFT 6 through at least one first via hole. In addition, a plurality of second via holes are formed in the reference portion 31, the first passivation layer 7 and the gate insulating layer 62, and each of the common electrodes 5 is coupled to a corresponding signal line 2 (e.g., a corresponding common electrode line) through at least one second via hole.

In some other examples, as shown in FIG. 1, the pixel electrodes 4 are disposed in the same layer, and the common electrodes 5 are disposed in another layer. In this case, for example, the array substrate 100 is a fringe field switching (FFS) array substrate.

In addition, the pixel electrodes 4 may be formed by etching a fourth metal film, and the common electrodes 5 may be formed by etching a fifth metal film. In some examples, any one of the fourth metal film and the fifth metal film is made of the ITO or IZO material.

In some embodiments, in order to electrically insulate an electrode layer where the pixel electrodes 4 are located from an electrode layer where the common electrodes 5 are located, the array substrate 100 further includes a second passivation layer 8 disposed between pixel electrodes 4 and the common electrodes 5.

On this basis, in some embodiments, as shown in FIG. 1, a plurality of third via holes G1 are formed in the second passivation layer 8, the reference portion 31, the first passivation layer 7, and the gate insulating layer 62, and each of the common electrodes 5 is coupled to a corresponding signal line 2 (e.g., a corresponding common electrode line) through at least one third via hole G1.

In some embodiments, as shown in FIG. 1, a plurality of fourth via holes G2 are formed in the reference portion 31 and the first passivation layer 7, and each of the pixel electrode 4 is coupled to the drain 65 of a corresponding TFT 6 through at least one fourth via hole G2.

As can be seen from the above embodiments, at least one insulating layer including the first passivation layer 7 and the gate insulating layer 62 are disposed between the at least one electrode and the plurality of signal lines 2, so as to avoid signal interference generated between the at least one electrode and the plurality of signal lines 2.

In this case, in addition to the organic layer 3, the at least one insulating layer is disposed between the at least one electrode and the plurality of signal lines 2. In this way, the thickness of the organic layer 3 may be appropriately designed to avoid the parasitic capacitances from existing between the at least one electrode and the plurality of signal lines 2, or to effectively reduce the parasitic capacitances that exist between the at least one electrode and the plurality of signal lines 2, thereby reducing loads of the plurality of signal lines 2, and further reducing the load and power consumption of the array substrate 100.

Figure 6:
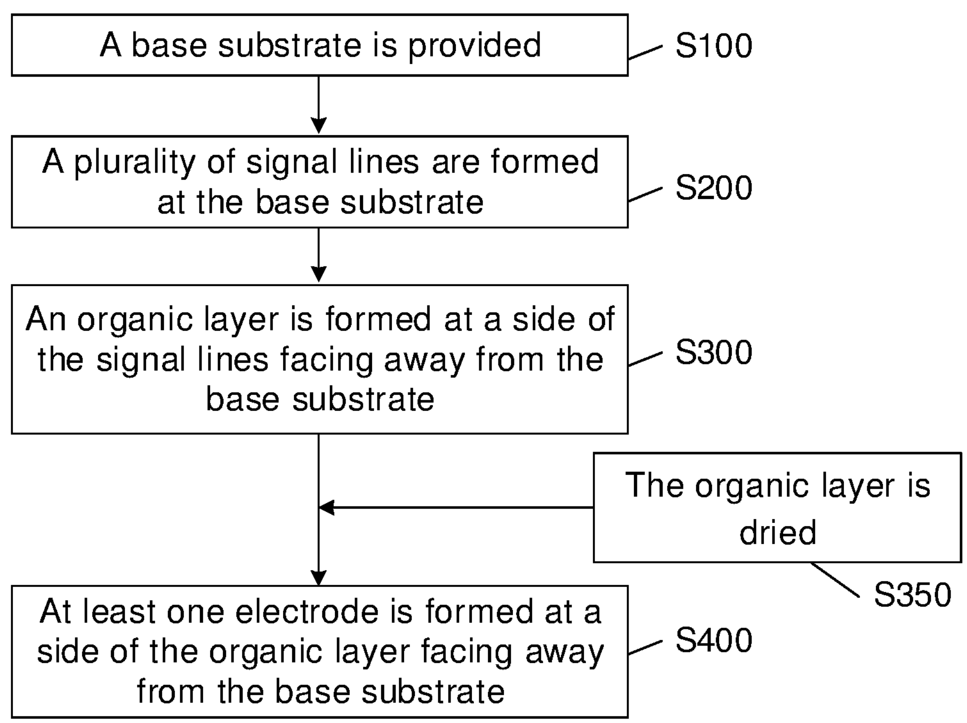
FIG. 6 is a flow diagram of a method of manufacturing an array substrate, according to some embodiments of the present disclosure.
Figure 7:
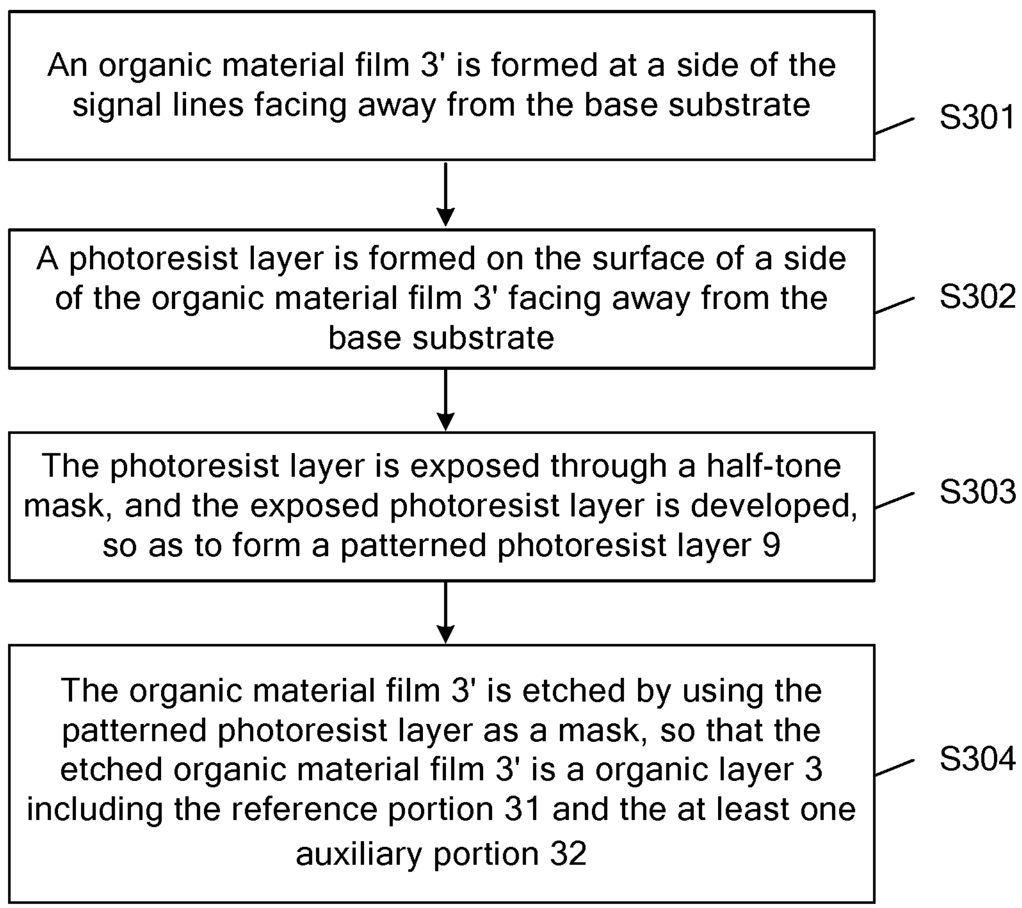
FIG. 7 is a flow diagram of a method of manufacturing an organic layer of an array substrate, according to some embodiments of the present disclosure.

Some embodiments of the present disclosure provide a method of manufacturing the array substrate 100 provided by some of the above embodiments. Referring to FIG. 6, the method of manufacturing the array substrate includes step 100 to step 300 (S100-S300).

In S100, a base substrate is provided.

The type of the above base substrate can be selected according to actual needs. In some embodiments, the array substrate to be manufactured is an LCD substrate, and the base substrate is selected from a rigid base substrate such as a glass base substrate. In some other embodiments, the base substrate to be manufactured is an OLED substrate, and the base substrate is selected from a rigid base substrate such as a glass base substrate, or a flexible base substrate such as a PET base substrate, a PEN base substrate, or a PI base substrate.

In S200, a plurality of signal lines are formed at a side of the base substrate.

In some embodiments, the signal lines are formed directly on the base substrate. In some other embodiments, before S200, the method of manufacturing the array substrate further includes: forming at least one layer on the base substrate, and the signal lines are formed on a surface of the at least one layer facing away from the base substrate.

In some embodiments, the signal lines include a plurality of gate lines. In some examples, the step of forming the plurality of signal lines on the base substrate, includes: forming a first metal film on the base substrate, and performing a single patterning process on the first metal film to form the plurality of signal lines. The first metal film is made of a metal material such as Al, Cu, Mo or Ti.

In some other embodiments, the signal lines include a plurality of data lines. In some examples, the step of forming the plurality of signal lines on the base substrate, includes: forming a second metal film on the base substrate, and performing a single patterning process on the second metal film to form the plurality of signal lines. The second metal film is made of a metal material such as Mo, Al, Cu or Cr.

In yet some other embodiments, the signal lines include a plurality of common electrode lines. In some examples, the step of forming the plurality of signal lines on the base substrate includes: forming a metal film on the base substrate, and performing a single patterning process on the metal film to form the plurality of common electrode lines. The metal film is made of a metal material such as Mo, Al, Cu or Cr.

In yet some other embodiments, the plurality of signal lines include the gate lines, the data lines, and the common electrode lines. The manufacturing processes of the gate lines, the data lines, and the common electrode lines can refer to the manufacturing process in some of the foregoing embodiments.

In some embodiments, the gate lines and the common electrode lines are located in a same layer, and the gate lines and the data lines are located in different layers. The method of manufacturing the array substrate further includes a step of forming at least one insulating layer between the layer where the gate lines and the common electrode lines are located and the layer where the data lines are located.

In S300, an organic layer is formed at a side of the signal lines facing away from the base substrate.

Here, the organic layer includes at least one auxiliary portion and a reference portion surrounding the at least one auxiliary portion. A thickness of each auxiliary portion is less than a thickness of the reference portion.

The thickness of the reference portion is a distance between a surface of the reference portion proximate to the base substrate and a surface of the reference portion facing away from the base substrate. The thickness of each auxiliary portion is a distance between a surface of the auxiliary portion proximate to the base substrate and a surface of the auxiliary portion facing away from the base substrate.

In some embodiments, an orthographic projection of each auxiliary portion on the base substrate is located outside a range of an orthographic projection of the signal lines on the base substrate.

In some embodiments, the organic layer is formed by using a half-tone mask process or a single slit mask process. For example, referring to FIGS. 7 and 8, the organic layer is formed by using the half-tone mask process, and the step of forming an organic layer at a side of the signal lines facing away from the base substrate, includes step 301 to step 304 (S301-S304).

In S301, an organic material film 3' is formed at a side of the signal lines facing away from the base substrate.

In S302, a photoresist layer is formed on a surface of the organic material film 3' facing away from the base substrate.

In some embodiments, the photoresist layer is a positive photoresist layer or a negative photoresist layer. The type of the photoresist layer can be selected and set according to actual needs.

Hereinafter, a description will be given by taking the photoresist layer being the positive photoresist layer as an example.

In S303, the photoresist layer is exposed through a half-tone mask, and the exposed photoresist layer is developed, so as to form a patterned photoresist layer 9.

Figure 8:
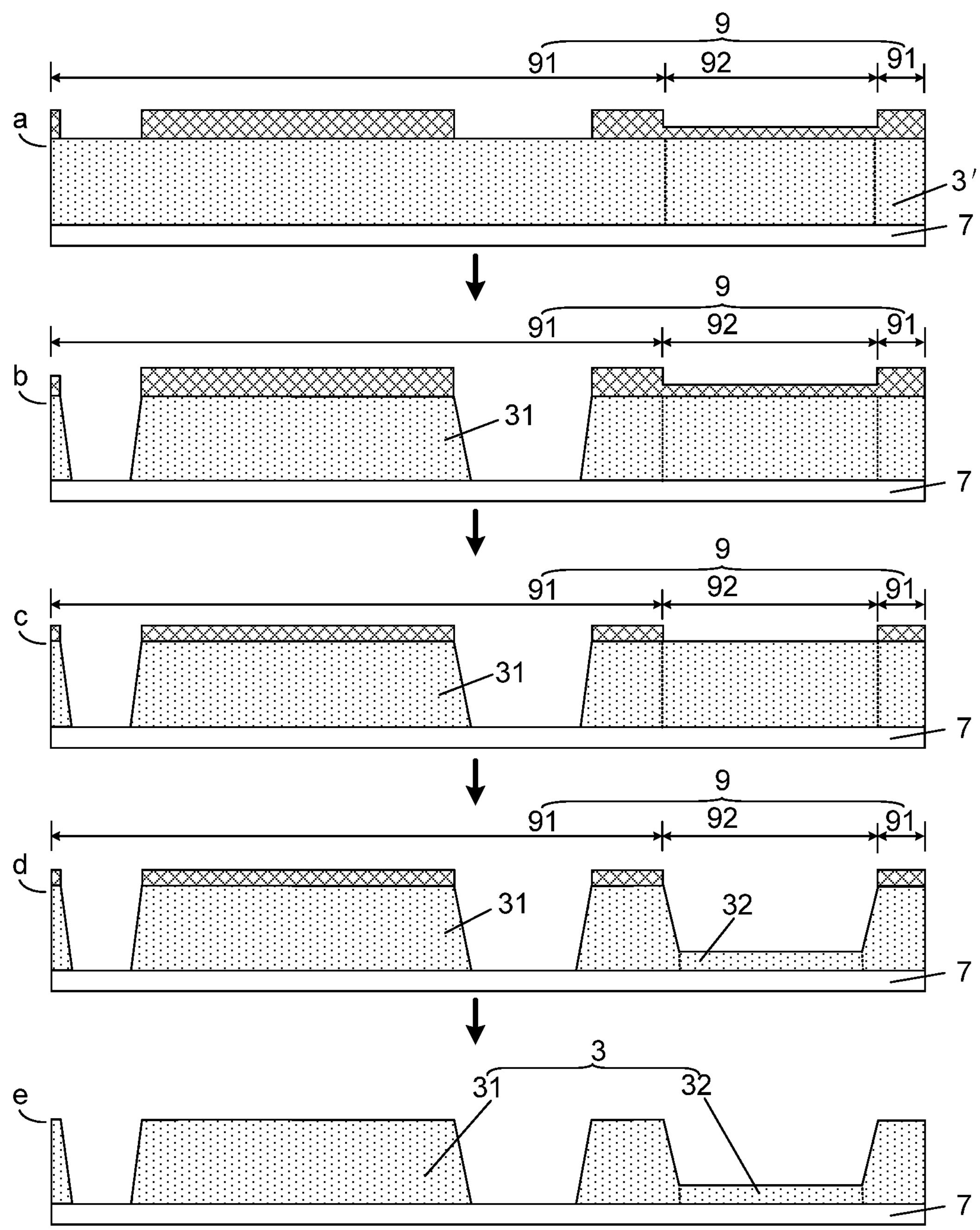
FIG. 8 is a flow diagram of a method of manufacturing another organic layer of an array substrate, according to some embodiments of the present disclosure.

Referring to part a in FIG. 8, in the process of exposing the photoresist layer by using a halftone mask and developing the exposed photoresist layer, different portions corresponding to the photoresist layer are respectively exposed and developed to different degrees, and the photoresist layer is patterned to ensure the patterned photoresist layer 9 to include a first pattern portion 91 and at least one second pattern portion 92 each connected to the first pattern portion 91. The first pattern portion 91 is directly opposite a portion of the reference portion to be formed in the organic material film 3', and each of the at least one second pattern portion 92 is directly opposite a portion of a corresponding auxiliary portion to be formed in the organic material film 3'.

In S304, the organic material film 3' is etched by using the patterned photoresist layer as a mask, so that the etched organic material film 3' is an organic layer 3 including the reference portion 31 and the at least one auxiliary portion 32.

Here, the reference portion 31 is connected to the at least one auxiliary portion 32.

With continuous reference to the part a in FIG. 8, the first pattern portion 91 in the patterned photoresist layer 9 includes a plurality of openings. There is a one-to-one correspondence relationship between the openings and a plurality of via holes to be formed in the reference portion 31, that is, the reference portion 31 to be formed has a pattern structure, and the reference portion 31 may also be referred to as a patterned reference portion.

A thickness of each second pattern portion 92 is less than a thickness of the first pattern portion 91, and each second pattern portion 92 corresponds to an auxiliary portion 32 to be formed.

In some embodiments, the step of etching the organic material film 3', includes step 3041 to step 3044 (S3041-S3044).

In S3041, referring to part b in FIG. 8, the first etching for the organic material film 3' is performed by using the patterned photoresist layer 9 as a mask and using the openings of the first pattern portion 91 in the patterned photoresist layer 9, so that a portion of the organic material film 3' is formed into the patterned reference portion 31, and the via holes in the patterned reference portion 31 include a plurality of third via holes G1 and a plurality of fourth via holes G2.

In S3042, referring to part c in FIG. 8, each second pattern portion 92 in the patterned photoresist layer 9 is removed to expose a corresponding portion of the organic material film below.

In S3043, referring to part d in FIG. 8, the second etching for the organic material film 3' after the first etching is performed by using the remaining patterned photoresist layer 9 as a mask, so that the thickness of a portion of the organic material film 3' directly opposite the at least one second pattern portion 92 is thinned to form at least one auxiliary portion 32 connected to the patterned reference portion 31.

In this way, the thickness of each auxiliary portion 32 is less than the thickness of the patterned reference portion 31.

In S3044, referring to part e in FIG. 8, the remaining patterned photoresist layer 9 is stripped.

In this way, the organic layer 3 is formed by using a half-tone mask process, and the desired patterned photoresist layer 9 can be formed in a single patterning process, which is advantageous for simplifying a manufacturing process of the organic layer 3, and improving an efficiency of manufacturing the organic layer 3.

With continuous reference to FIG. 6, the method of manufacturing the array substrate further includes step 400 (S400).

In S400, at least one electrode is formed at a side of the organic layer facing away from the base substrate.

In some embodiments, the at least one electrode includes at least one pixel electrode. In some other embodiments, the at least one electrode includes at least one common electrode. In yet some other examples, the at least one electrode includes at least one pixel electrode and at least one common electrode.

Here, for example, the at least one pixel electrode and at least one common electrode are formed in the same layer. In this way, the at least one pixel electrode and at least one common electrode may be formed by using the same third metal film in a single patterning process, and the third metal film is made of the ITO or IZO material.

For example, the at least one pixel electrode and at least one common electrode are formed in different layers. In this way, the at least one pixel electrode is formed by etching the same fourth metal film, and the at least one common electrode is formed by etching the same fifth metal film. Any one of the fourth metal film and the fifth metal film is made of the ITO or IZO material.

In some embodiments, referring to FIG. 6, after the step of forming an organic layer at a side of the signal lines in S300 facing away from the base substrate, the method of manufacturing the array substrate further includes step 350 (S350):

In S350, the organic layer is dried.

After the organic layer is formed, that is, after the organic layer is performed by a drying process, the organic layer may be effectively degassed and solidified, and the degassing effect of the organic layer in the drying process may be effectively improved by using the at least one auxiliary portion in the organic layer. In this way, the drying process may avoid the organic substance that is easily volatilized by heating in the organic layer from remaining in the organic layer, thereby ensuring a good quality and display effect of the formed array substrate.

Here, the degassing effect of the organic layer in the drying process is shown in FIG. 5, and each circle in FIG.

5 indicates a bubble formed inside the organic layer during a volatilization of the organic substance in the organic layer.

In some embodiments, an organic layer is disposed between the plurality of signal lines and the at least one electrode, which may facilitate reducing parasitic capacitance(s) existing between each signal line and a corresponding electrode, reducing the load of the plurality of signal lines, thereby reducing the load and power consumption of the array substrate. In addition, the patterned reference portion in the organic layer generally has a large thickness, and a portion that the organic layer is not located above the signal line, which is the at least one auxiliary portion, has a small thickness, which has no adverse influence on reducing the load of the plurality of signal lines.

The beneficial effects that can be achieved by the method of manufacturing the array substrate provided by some embodiments of the present disclosure are the same as the beneficial effects that can be achieved by the array substrate provided by some of the above embodiments, which will not be described here again.

In some embodiments, the method of manufacturing the array substrate further includes: forming a plurality of TFTs between the base substrate and the patterned reference portion of the organic layer. An orthographic projection of each of the TFTs on the base substrate is within an orthographic projection of the patterned reference portion on the base substrate, that is, there is no overlapping portion between the orthographic projection of TFTs on the base substrate and the orthographic projection of each auxiliary portion on the base substrate.

The array substrate has a plurality of sub-pixel regions arranged in an array, and each sub-pixel region is provided with at least one TFT therein. In this case, the organic layer is disposed between the at least one electrode and a plurality of pixel driving circuits each including at least one TFT.

In some embodiments, the patterned reference portion of the organic layer is disposed above the TFTs, that is, the patterned reference portion of the organic layer is disposed above the plurality of pixel driving circuits. In this way, the patterned reference portion can be utilized to avoid the parasitic capacitance(s) from existing between each pixel driving circuit and at least one electrode corresponding to the pixel driving circuit, or to effectively reduce the parasitic capacitance(s) that exist between each pixel driving circuit and at least one electrode corresponding to the pixel driving circuit, so that each pixel driving circuit has a good stability, and thus the array substrate formed has a good stability.

In some embodiments, each TFT has a top gate structure. In some other embodiments, each TFT has a bottom gate structure shown in FIG. 1, in this case. The step of forming the TFT, includes: forming a gate on a surface of the base substrate; forming a gate insulating layer on a surface of the gate facing away from the base substrate and a surface of the base substrate not covered by the gate; forming an active layer on a surface of the gate insulating layer facing away from the base substrate; and forming a source and a drain on a surface of the active layer facing away from the base substrate.

Here, the source and the drain may be directly disposed on a surface of the active layer facing away from the substrate, that is, the source and the drain are directly connected to the active layer. For another example, an interlayer insulating layer is further formed between the active layer and a layer where the source and the drain are located. The source of each TFT is electrically connected to the active layer of the same TFT through a via hole disposed in the interlayer insulating layer, and the drain of each TFT is electrically connected to the active layer of the same TFT through a via hole disposed in the interlayer insulating layer.

The gate of each TFT and a gate line corresponding to a sub-pixel region where this TFT 6 is located are formed in the same layer, that is, the gate and the gate line are formed in a single patterning process. In a case where a gate is connected to a corresponding gate line, the gate and the gate line are generally a integrated structure.

The source and the drain of each TFT and a data line corresponding to a sub-pixel region where this TFT 6 is located are formed in the same layer, that is, the source, the drain, and the data line are formed in a single patterning process. In a case where a source is connected to a corresponding data line, the source and the data line are generally an integrated structure.

It will be noted that, since the source and drain of the same TFT are generally symmetrical in structure and composition, there is no difference between the source and the drain. In some embodiments, in order to distinguish the two electrodes in the same TFT except the gate, one of the electrodes is referred to as a source and another electrode is referred to as a drain.

In some embodiments, after forming the TFTs, and before forming the organic layer, the method of manufacturing the array substrate further includes step 360 (S360).

In S360, a first passivation layer is formed on a surface of the TFTs facing away from the base substrate.

Each signal line corresponds to at least one first via hole among the first via holes of the patterned reference portion in the organic layer, and each second via hole of the patterned reference portion corresponds to a TFT. In this way, each first via hole is located above a corresponding signal line thereof, and each first via hole extends through the first passivation layer and the gate insulating layer above the signal line. Each second via hole is located above a drain of a corresponding TFT, and each second via hole extends through the first passivation layer above the drain.

In some embodiments, after forming the organic layer, the method of manufacturing the array substrate further includes step 370 to step 390 (S370-S390).

In S370, at least one pixel electrode is formed on a surface of the organic layer facing away from the base substrate. Each pixel electrode corresponds to a single second via hole, so that each pixel electrode is coupled to a drain of a corresponding TFT through the corresponding second via hole.

In S380, a second passivation layer is formed on a surface of the at least one pixel electrode facing away from the base substrate, and each first via hole further extends through the second passivation layer.

In S390, at least one common electrode is formed on a surface of the second passivation layer facing away from the base substrate, so that each of the at least one common electrode corresponds to a first via hole, and each common electrode is coupled to a corresponding signal line (e.g., a common electrode line) through the corresponding first via hole.

Figure 9:
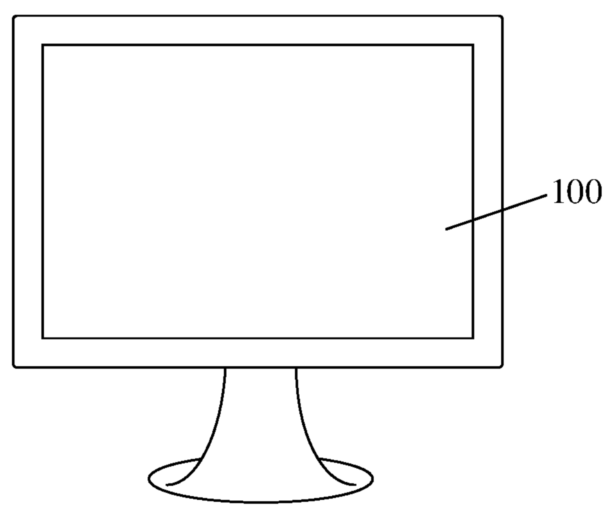
FIG. 9 is a schematic diagram of a display device, according to some embodiments of the present disclosure.

Some embodiments of the present disclosure provide a display device 200. As shown in FIG. 9, the display device 200 includes the array substrate 100 provided by some of the above embodiments.

The array substrate 100 in the display device 200 has the same advantages as the array substrate 100 in some of the above embodiments, which will not be described here again.

In some embodiments, the display device is a product or component having a display function, such as a cell phone, a tablet, a laptop, a display, a television, a digital photo frame, or a navigator.

In the above description of the embodiments, specific features, structures, materials or characteristics may be combined in any suitable manner in any one or more embodiments or examples.

The above embodiments are merely some specific embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

What is claimed is:

1. An array substrate, comprising:

a base substrate;

a plurality of signal lines disposed at a side of the base substrate; and an organic layer disposed at a side of the plurality of signal lines facing away from the base substrate, wherein the organic layer includes at least one auxiliary portion and a reference portion surrounding the at least one auxiliary portion, and a thickness of each auxiliary portion is less than a thickness of the reference portion;

the thickness of each auxiliary portion is less than or equal to one third of the thickness of the reference portion, and the thickness of each auxiliary portion is less than or equal to a value in a range of 0.8 μm to 1.2 μm; and the at least one auxiliary portion includes a plurality of auxiliary portions, and thicknesses of the plurality of auxiliary portions are the same.

2. The array substrate according to claim 1, wherein an orthographic projection of each auxiliary portion on the base substrate is located outside a range of an orthographic projection of the plurality of signal lines on the base substrate.

3. The array substrate according to claim 2, further comprising at least one electrode disposed at a side of the organic layer facing away from the base substrate.

4. The array substrate according to claim 3, wherein the reference portion is coupled to the at least one auxiliary portion.

5. The array substrate according to claim 3, wherein the plurality of signal lines are selected from a group consisting of:

a plurality of gate lines, a plurality of data lines, a plurality of common electrode lines, and a combination thereof.

6. The array substrate according to claim 3, wherein the at least one electrode includes at least one pixel electrode;

or the at least one electrode includes at least one common electrode; or the at least one electrode includes at least one pixel electrode and at least one common electrode.

7. The array substrate according to claim 3, further comprising a plurality of thin film transistors disposed between the base substrate and the reference portion of the organic layer.

8. The array substrate according to claim 7, wherein an orthographic projection of each auxiliary portion on the base substrate is further located outside a range of an orthographic projection of the plurality of thin film transistors on the base substrate.

9. A display device, comprising the array substrate according to claim 1.

10. A method of manufacturing an array substrate, comprising:

providing a base substrate;

forming a plurality of signal lines at the base substrate; and forming an organic layer at a side of the plurality of signal lines facing away from the base substrate, wherein the organic layer includes at least one auxiliary portion and a reference portion surrounding the at least one auxiliary portion, and a thickness of each auxiliary portion is less than a thickness of the reference portion;

the thickness of each auxiliary portion is less than or equal to one third of the thickness of the reference portion, and the thickness of each auxiliary portion is less than or equal to a value in a range of 0.8 μm to 1.2 μm; and the at least one auxiliary portion includes a plurality of auxiliary portions, and thicknesses of the plurality of auxiliary portions are the same.

11. The method of manufacturing the array substrate according to claim 10, wherein an orthographic projection of each auxiliary portion on the base substrate is located outside a range of an orthographic projection of the plurality of signal lines on the base substrate.

12. The method of manufacturing the array substrate according to claim 11, further comprising forming at least one electrode at a side of the organic layer facing away from the base substrate.

13. The method of manufacturing the array substrate according to claim 12, wherein the step of forming the organic layer at the side of the plurality of signal lines facing away from the base substrate, includes:

forming an organic material film at the side of the plurality of signal lines facing away from the base substrate;

forming a photoresist layer on the surface of the organic material film facing away from the base substrate;

exposing the photoresist layer through a half-tone mask and developing the exposed photoresist layer, so as to form a patterned photoresist layer; and etching the organic material film by using the patterned photoresist layer as a mask, so that the etched organic material film is the organic layer including a reference portion and at least one auxiliary portion.

14. The method of manufacturing the array substrate according to claim 13, wherein after the step of forming the organic layer at the side of the plurality of signal lines facing away from the base substrate, the manufacturing method further comprising:

drying the organic layer.

15. The method of manufacturing the array substrate according to claim 12, wherein the step of forming the plurality of signal lines at a side of the base substrate, includes:

forming a plurality lines selected from a group consisting of a plurality of gate lines, a plurality of data lines, a plurality of common electrode lines, and a combination thereof.

16. The method of manufacturing the array substrate according to claim 12, wherein the step of forming the at least one electrode at the side of the organic layer facing away from the base substrate, includes:

forming at least one pixel electrode at the side of the organic layer facing away from the base substrate;

or forming at least one common electrode at the side of the organic layer facing away from the base substrate; or forming at least one pixel electrode and at least one common electrode at the side of the organic layer facing away from the base substrate.

* * * * *